US011996850B2

(12) United States Patent
Das

(10) Patent No.: US 11,996,850 B2
(45) Date of Patent: May 28, 2024

(54) COMPARATOR WITH REDUCED OFFSET

(71) Applicant: TEXAS INSTRUMENTS INCORPORATED, Dallas, TX (US)

(72) Inventor: Abhijit Kumar Das, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/673,224

(22) Filed: Feb. 16, 2022

(65) Prior Publication Data

US 2023/0096787 A1 Mar. 30, 2023

Related U.S. Application Data

(60) Provisional application No. 63/249,075, filed on Sep. 28, 2021.

(51) Int. Cl.
*H03K 5/24* (2006.01)

(52) U.S. Cl.
CPC .................. *H03K 5/249* (2013.01)

(58) Field of Classification Search
CPC .. H03K 5/2481; H03K 17/693; H03K 17/063; H03K 17/0822; H03K 17/6874; H03K 17/6871; H03K 5/249; H03F 3/45179; H03F 3/4521; H03F 3/45071; H03F 1/523; H03F 2203/45074; H03F 3/45183; H03F 3/45165; H03F 3/45269; H03F 3/4517; H03F 3/45264; H03F 3/45466; H03F 3/45363; H03F 3/45367; H03F 3/45461; H03F 2203/45426; H03F 3/45475; H03F 1/52; G05F 3/30

See application file for complete search history.

(56) References Cited

U.S. PATENT DOCUMENTS

| 2006/0164125 | A1* | 7/2006 | Mulder | H03F 3/45632 327/52 |
| 2012/0153991 | A1* | 6/2012 | Cheong | H03F 3/45744 327/63 |
| 2016/0336932 | A1* | 11/2016 | Huang | H03K 5/2472 |

* cited by examiner

*Primary Examiner* — Lincoln D Donovan
*Assistant Examiner* — Tyler J Pereny
(74) *Attorney, Agent, or Firm* — Michael T. Gabrik; Frank D. Cimino

(57) ABSTRACT

A device includes a first transistor (M1) having a control terminal that is a first comparator input, a first terminal that can be coupled to a voltage source, and a second terminal that provides a first comparator output; a second transistor (M2) having a control terminal that is a second comparator input, a first terminal that can be coupled to the voltage source, and a second terminal that provides a second comparator output; a third transistor (M3) having a control terminal coupled to M1, and a first terminal coupled to ground; a fourth transistor (M4) having a control terminal coupled to M2, and a first terminal coupled to ground; first switches that couple M3 second terminal to M3 control terminal, and M4 second terminal to M4 control terminal; and second switches that couple M3 second terminal to the M2 second terminal, and M4 second terminal to the M1 second terminal.

20 Claims, 4 Drawing Sheets

COMPARATOR WITH REDUCED OFFSET

CROSS-REFERENCE TO RELATED APPLICATIONS

The present application claims priority to U.S. Provisional Patent Application No. 63/249,075, which was filed Sep. 28, 2021, is titled "ANALOG COMPARATOR WITH OFFSET VOLTAGE CORRECTION," and is hereby incorporated herein by reference in its entirety.

BACKGROUND

Analog comparators receive first and second input voltages and provide an output voltage or signal based on which of the two input voltages is greater. For example, the output signal is asserted (e.g., logic high) responsive to the first input voltage being greater than the second input voltage, and is de-asserted (e.g., logic low) responsive to the first input voltage being less than the second input voltage. The output signal of an ideal analog comparator switches instantly and completely as the first voltage becomes greater than the second voltage and vice versa. However, the output signal of a real word comparator may not switch until the first voltage is greater than (or less than) the second voltage plus or minus an offset voltage, depending on whether the offset voltage is positive or negative. The particular offset voltage may have systemic and environmental components and can vary over time. Accordingly, it is useful to improve or reduce the offset of a comparator.

SUMMARY

In accordance with an example of this description, a device includes a first transistor having first transistor first and second terminals and a first transistor control terminal, where the first transistor control terminal is a first comparator input terminal, where the first transistor first terminal is adapted to be coupled to a supply voltage source, and where the first transistor second terminal is configured to provide a first comparator output. The device also includes a second transistor having second transistor first and second terminals and a second transistor control terminal, where the second transistor control terminal is a second comparator input terminal, where the second transistor first terminal is adapted to be coupled to the supply voltage source, and where the second transistor second terminal is configured to provide a second comparator output. The device further includes a third transistor having third transistor first and second terminals and a third transistor control terminal, where the third transistor control terminal is coupled to the first transistor second terminal, and where the third transistor first terminal is adapted to be coupled to a ground node. The device also includes a fourth transistor having fourth transistor first and second terminals and a fourth transistor control terminal, where the fourth transistor control terminal is coupled to the second transistor second terminal, and where the fourth transistor first terminal is adapted to be coupled to the ground node. The device includes a first set of switches configured to selectively couple the third transistor second terminal to the third transistor control terminal, and to selectively couple the fourth transistor second terminal to the fourth transistor control terminal. The device also includes a second set of switches configured to selectively couple the third transistor second terminal to the second transistor second terminal, and to selectively couple the fourth transistor second terminal to the first transistor second terminal.

In accordance with another example of this description, a device includes a comparator circuit configured to receive a first comparator input and a second comparator input, and to provide a comparator output responsive to the first and second comparator inputs. The comparator circuit includes a first transistor adapted to be coupled to a supply voltage source and coupled to a first output node, where the first transistor is controlled responsive to the first comparator input. The comparator circuit also includes a second transistor adapted to be coupled to the supply voltage source and coupled to a second output node, where the second transistor is controlled responsive to the second comparator input. The comparator circuit further includes a third transistor adapted to be coupled to a ground node and coupled to a first switched node, where the third transistor is controlled responsive to a voltage at the first output node. The comparator circuit also includes a fourth transistor adapted to be coupled to the ground node and coupled to a second switched node, where the fourth transistor is controlled responsive to a voltage at the second output node. A first set of switches is configured to selectively couple the first switched node to the first output node, and to selectively couple the second switched node to the second output node. A second set of switches is configured to selectively couple the first switched node to the second output node, and to selectively couple the second switched node to the first output node. The comparator is configured to provide the comparator output responsive to the voltage at the first output node or the voltage at the second output node. The device also includes a control circuit coupled to the comparator circuit. The control circuit is configured to close the first set of switches at a first time, such that each of the third and fourth transistors is diode-connected; and to close the second set of switches at a second time subsequent to the first time, such that the third and fourth transistors are cross-coupled.

In accordance with yet another example of this description, a method includes providing, by a comparator circuit, a comparator output responsive to a first comparator input and a second comparator input. The comparator circuit includes a first transistor adapted to be coupled to a supply voltage source and coupled to a first output node, where the first transistor is controlled responsive to the first comparator input. The comparator circuit also includes a second transistor adapted to be coupled to the supply voltage source and coupled to a second output node, where the second transistor is controlled responsive to the second comparator input. The comparator circuit further includes a third transistor adapted to be coupled to a ground node and coupled to a first switched node, where the third transistor is controlled responsive to a voltage at the first output node. The comparator circuit also includes a fourth transistor adapted to be coupled to the ground node and coupled to a second switched node. The fourth transistor is controlled responsive to a voltage at the second output node, and the comparator output is provided responsive to the voltage at the first output node or the voltage at the second output node. The method also includes controlling a first set of switches, at a first time, to couple the first switched node to the first output node, and to couple the second switched node to the second output node; and controlling a second set of switches, at a second time subsequent to the first time, to couple the first switched node to the second output node, and to couple the second switched node to the first output node.

BRIEF DESCRIPTION OF THE DRAWINGS

For a detailed description of various examples, reference will now be made to the accompanying drawings in which.

DETAILED DESCRIPTION

Figures 1, 2:
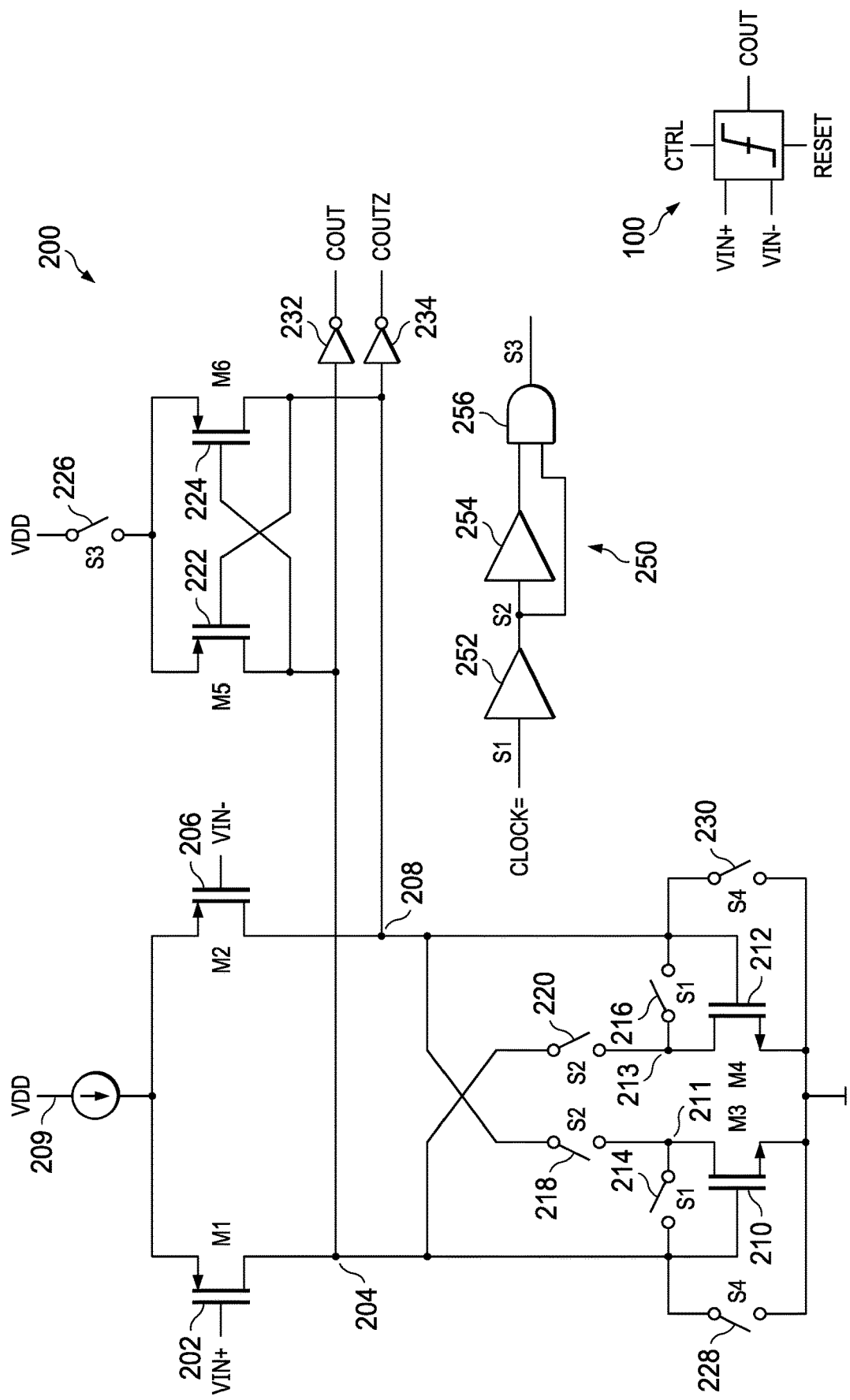
FIG. 1 is a schematic diagram of a clocked comparator in accordance with various examples.
FIG. 2 is a schematic circuit diagram of the clocked comparator of FIG. 1 in accordance with various examples.

Comparator offset is often related to or correlated with the speed of the comparator. For example, a comparator that is faster (e.g., having a lower output signal response time to changes in input voltages) can have a greater offset than a similar comparator that is slower. For example, increasing the size of switching devices (e.g., transistors) of the comparator can reduce the offset of the comparator, but at the cost of the comparator having a relatively slower response time. Also, larger switching devices consume relatively more power, and thus are not desirable in some cases. Accordingly, it is useful to improve or reduce the offset of a comparator without resorting to increasing the size of transistor(s) of the comparator.

Examples of the present description address the foregoing by providing an analog comparator circuit that is configured to operate in multiple operating phases to reduce an offset of the comparator. The comparator circuits described herein are clocked comparators, in which the comparator is triggered by a rising and/or falling edge of a clock signal, and thus the comparison implemented by the comparator is performed at regular intervals based on the clock signal (e.g., once per clock cycle). As described below, one source of comparator offset is a threshold voltage (Vt) mismatch between pairs of transistors in the comparator topology. Also, n-type metal-oxide-semiconductor (NMOS) transistors often have worse Vt matching than p-type metal-oxide-semiconductor (PMOS) transistors.

Accordingly, examples of this description reduce the offset of the comparator by compensating, correcting, or otherwise reducing the Vt mismatch between at least one pair of transistors in the comparator topology. In one example, the Vt mismatch of a pair of NMOS transistors is reduced. In this example, the gates of the NMOS transistor pair correspond to the outputs of the comparator (e.g., the gate of one of the NMOS transistors corresponds to the non-inverted output of the comparator, and the gate of the other of the NMOS transistors corresponds to the inverted output of the comparator) and can be coupled to output terminals of the comparator, such as by a buffer (or an inverter). The Vt mismatch of the NMOS transistor pair is compensated by providing, for example, a first operating phase (or a diode-connected operating phase), in which a controller causes each of the NMOS transistors (e.g., of the NMOS transistor pair) of the comparator topology to be diode-connected (e.g., by coupling the gate of each NMOS transistor to the drain of the same NMOS transistor). As described further below, in the diode-connected operating phase, the NMOS transistor of the pair that has a higher Vt will have a correspondingly higher gate-source voltage as well, which reduces the impact of the Vt mismatch between the NMOS transistors in subsequent operating phases.

A second operating phase is a NMOS positive feedback phase, in which the controller causes the NMOS transistor pair of the comparator topology to be cross-coupled (e.g., by coupling the gate of one NMOS transistor to the drain of the other NMOS transistor, and vice versa). The impact of the Vt mismatch between the NMOS transistors is reduced in the NMOS positive feedback phase, because the positive feedback in this phase is dependent on the gate voltages developed in the diode-connected phase, in which the NMOS transistor having a higher Vt has a correspondingly higher gate voltage as well.

Finally, a third operating phase is a PMOS positive feedback phase, in which the controller causes a PMOS transistor pair of the comparator topology to operate in conjunction with the NMOS transistor pair to more quickly drive the output voltages to the supply and ground voltages, respectively, to provide a comparator output that is useful for a digital circuit. These and other examples are described further below, with reference made to the accompanying figures.

In some examples, the second and third operating phases are merged (e.g., occur with some overlap). In these examples, a speed or latency of the comparator can be improved (e.g., reduced), as described further below.

FIG. 1 is a schematic diagram of a clocked comparator 100 in accordance with examples of this description. The comparator 100 has a first input terminal (VIN+) and a second input terminal (VIN−). The comparator 100 also has an output terminal (COUT). Although not shown in FIG. 1 for simplicity, the comparator 100 can also include an inverting output terminal (COUTZ), while COUT is a non-inverting output terminal. For simplicity, VIN+ and VIN− can also refer to the first input voltage and the second input voltage (e.g., the voltage at the corresponding terminals), respectively, while COUT and COUTZ can also refer to the non-inverted output voltage and the inverted output voltage (e.g., the voltage at the corresponding terminals), respectively. The comparator 100 includes a control input (CTRL) configured to receive one or more control signals, and a reset input (RESET) configured to receive a reset signal.

As described above, the comparator 100 is configured to receive first and second input voltages at VIN+ and VIN−, respectively. The comparator 100 is configured to provide an output voltage at COUT responsive to the first and second input voltages. For example, the output voltage at COUT is asserted responsive to the first input voltage (VIN+) being greater than the second input voltage (VIN−), and is de-asserted responsive to the first input voltage (VIN+) being less than the second input voltage (VIN−). Further, the comparator 100 is a clocked comparator, and thus is configured to provide a voltage at COUT responsive to the control input CTRL. The control signal received at CTRL is described further below, but can be a clock signal from an external circuit in at least one example. Irrespective of the format of the control signal, the comparator 100 is generally triggered by the control signal received at CTRL, and is subsequently reset by a reset signal received at RESET. The output of the comparator 100 is available (e.g., to other circuitry, not shown for simplicity) after being triggered by the control signal, and before being reset by the reset signal.

FIG. 2 is a schematic circuit diagram of the clocked comparator 100 of FIG. 1 in accordance with various examples. The comparator 100 is configured to be coupled to a supply voltage source, which provides the voltage VDD. The comparator 100 includes a first transistor 202 that is adapted to be coupled to the supply voltage source, and is also coupled to a first output node 204. A control terminal of the first transistor 202 is the first comparator input terminal VIN+, and is thus configured to receive the first comparator input voltage at VIN+. In an example, the first transistor 202 is a PMOS transistor having its source coupled to the supply voltage source, its drain coupled to the first output node 204, and having its gate coupled to VIN+.

The comparator 100 also includes a second transistor 206 that is adapted to be coupled to the supply voltage source, and is also coupled to a second output node 208. A control terminal of the second transistor 206 is the second comparator input terminal VIN−, and is thus configured to receive the second comparator input voltage at VIN−. In an example, the second transistor 206 is a PMOS transistor having its source coupled to the supply voltage source, its drain coupled to the second output node 208, and having its gate coupled to VIN−. The first transistor 202 and the second transistor 206 are also referred to as an input pair, or a PMOS input pair, because they are controlled by (e.g., their gates are configured to receive) the first and second comparator input voltages, respectively. The first transistor 202 and the second transistor 206 can be directly coupled to the supply voltage source or can be coupled to the supply voltage source through a current source 209, which controls power consumption of the comparator 100.

The comparator 100 includes a third transistor 210 that is adapted to be coupled to a ground node and that is coupled to a first switched node 211. A control terminal of the third transistor 210 is also coupled to the first output node 204. A fourth transistor 212 is also adapted to be coupled to the ground node, and is coupled to a second switched node 213. A control terminal of the fourth transistor 212 is coupled to the second output node 208. In an example, the third transistor 210 is an NMOS transistor having its source coupled to the ground node, having its gate coupled to the first output node 204, and having its drain coupled to the first switched node 211. In an example, the fourth transistor 212 is also an NMOS transistor having its source coupled to the ground node, having its gate coupled to the second output node 208, and having its drain coupled to the second switched node 213.

The comparator 100 also includes various switches that are controlled responsive to the control signal received at the CTRL input. The switches can be implemented as transistors in some examples, but are described as switches because they generally function in an open/closed fashion (e.g., are either fully off, or fully on). A first set of switches includes switch 214 and switch 216, which are transistors in an example, and which are controlled responsive to a signal S1. For example, the switches 214, 216 close responsive to S1 being asserted, and the switches 214, 216 open responsive to S1 being de-asserted. The switch 214 is thus configured to selectively couple the drain of the third transistor 210 (e.g., the first switched node 211) to the gate of the third transistor 210, and thus the first output node 204. Similarly, the switch 216 is thus configured to selectively couple the drain of the fourth transistor 212 (e.g., the second switched node 213) to the gate of the fourth transistor 212, and thus the second output node 208. The diode-connected operating phase corresponds to S1 being asserted, and the switches 214, 216 being closed, because each of the NMOS transistor pair (e.g., transistors 210, 212) are diode-connected (e.g., the gate of transistor 210 is coupled to the drain of transistor 210, and the gate of transistor 212 is coupled to the drain of transistor 212).

A second set of switches includes switch 218 and 220, which are transistors in an example, and which are controlled responsive to a signal S2. For example, the switches 218, 220 close responsive to S2 being asserted, and the switches 218, 220 open responsive to S2 being de-asserted. The switch 218 is thus configured to selectively couple the drain of the third transistor 210 to the gate of the fourth transistor 212, and thus the second output node 208. Similarly, the switch 220 is thus configured to selectively couple the drain of the fourth transistor 212 to the gate of the third transistor 210, and thus the first output node 204. The NMOS positive feedback operating phase corresponds to S2 being asserted, and the switches 218, 220 being closed, because the NMOS transistor pair (e.g., transistors 210, 212) is cross-coupled (e.g., the gate of transistor 210 is coupled to the drain of transistor 212, and the gate of transistor 212 is coupled to the drain of transistor 210).

The comparator 100 also includes a fifth transistor 222 that is adapted to be coupled to the supply voltage source, and is also coupled to the first output node 204. A sixth transistor 224 is also adapted to be coupled to the supply voltage source, and is coupled to the second output node 208. The fifth and sixth transistors 222, 224 are cross-coupled, and thus a control terminal of the fifth transistor 222 is coupled to the second output node 208, while a control terminal of the sixth transistor 224 is coupled to the first output node 204.

In an example, the fifth transistor 222 is a PMOS transistor having its source coupled to the supply voltage source (e.g., through a third switch 226, which is a transistor in an example), its drain coupled to the first output node 204, and having its gate coupled the second output node 208. In this example, the sixth transistor 224 is also a PMOS transistor having its source coupled to the supply voltage source, its drain coupled to the second output node 208, and having its gate coupled to the first output node 204.

The third switch 226 is controlled responsive to a signal S3. For example, the third switch 226 closes responsive to S3 being asserted, and the third switch 226 opens responsive to S3 being de-asserted. The third switch 226 is thus configured to selectively couple the supply voltage source to the sources of the fifth and sixth transistors 222, 224. When S3 is open, the PMOS transistor pair (e.g., transistors 222, 224) does not affect the voltage at the first output node 204 or the second output node 208. The PMOS positive feedback operating phase thus corresponds to S3 being asserted, and the third switch 226 being closed, because the PMOS transistor pair 222, 224 operates in conjunction with the NMOS transistor pair 210, 212 to more quickly drive the voltages at the first output node 204 and the second output node 208 to the supply and ground voltages, as described further below.

A fourth set of switches includes switch 228 and 230, which are controlled responsive to a signal S4. In an example, S4 is generated responsive to the reset signal received at RESET of the comparator 100. For example, the switches 228, 230 close responsive to S4 being asserted, and the switches 228, 230 open responsive to S4 being de-asserted. The switch 228 is thus configured to selectively couple the first output node 204 to the ground node. Similarly, the switch 230 is thus configured to selectively couple the second output node 208 to the ground node. A reset phase corresponds to S4 being asserted, and the switches 228, 230 being closed, because first output node 204 and the second output node 208 are discharged to ground.

Finally, in the example of FIG. 2, the comparator 100 includes output buffers 232, 234, which are inverters in this example. The inverter 232 provides COUT responsive to the voltage at the first output node 204, and the inverter 234 provides COUTZ responsive to the voltage at the second output node 208.

Referring again to FIG. 1, the comparator 100 receives a control signal at the CTRL input. The switch control signals S1-S3 are generated responsive to the control signal. In a first example, switch control signals S1-S3 are generated externally from the comparator 100, and thus the control signal received at the CTRL input includes the switch control signals S1-S3. In a second example, the control signal received at the CTRL input is a multi-phase clock signal, and the switch control signals S1-S3 each correspond to a different phase of the multi-phase clock signal. In the second example, the switch control signals S1-S3 are thus derived from the multi-phase clock signal. In a third example, the control signal received at the CTRL input is a clock signal (or a single phase of a multi-phase clock signal), and the switch control signals S1-S3 are generated by circuitry internal to the comparator 100 responsive to the clock signal received at the CTRL input.

As one illustrative, but not limiting example, the comparator 100 includes switch control circuit 250. The switch control circuit 250 is configured to receive a clock signal from the CTRL input, which corresponds to S1. Accordingly, when the clock signal (e.g., a rising edge) is received, S1 is thus asserted and the first set of switches 214, 216 closes, which corresponds to the diode-connected operating phase. A first delay buffer 252 receives S1 as its input, and provides S2 as its output after a certain amount of delay. A second delay buffer 254 receives S2 as its input, and provides an output that is delayed responsive to S2. An AND gate 256 receives the output of the first delay buffer 252 and the output of the second delay buffer 254 as its input, and provides S3 as its output. Accordingly, S3 is asserted after a delay from S2 being asserted, and is de-asserted responsive to S2 being de-asserted. In some examples, the delay(s) described herein can be user-configurable for particular application use cases. Further, the foregoing is just one example of a switch control circuit 250. The particular functionality described herein, as well as the transition from the diode-connected operating phase, to the NMOS positive feedback operating phase, to the PMOS positive feedback operating phase can be accomplished using other, functionally-similar circuits.

Figure 3:
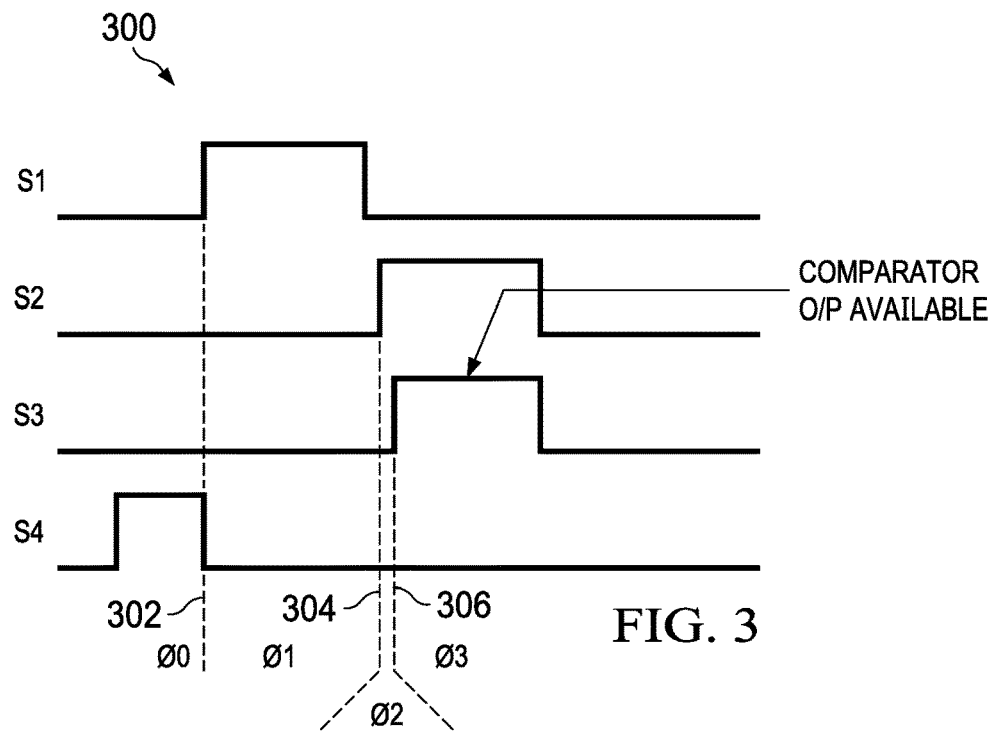
FIG. 3 is a timing diagram of control signals to control the clocked comparator of FIGS. 1 and 2 in accordance with various examples.

Irrespective of how the switch control signals S1-S3 are generated, FIG. 3 is a timing diagram 300 of the switch control signals S1-S3 used to control the comparator 100 of FIGS. 1 and 2 in accordance with various examples. Prior to a first time 302, the comparator 100 receives an asserted reset signal (e.g., at the RESET input) and thus S4 is asserted. The switches 228, 230 are closed responsive to S4 being asserted, and thus the first output node 204 and the second output node 208 are discharged to ground.

At the first time 302, a control signal is received that causes S1 to be asserted. In this example, S4 is also de-asserted at the first time 302, although in other examples S4 could be de-asserted prior to time 302. The diode-connected operating phase begins at the first time 302, because the first set of switches 214, 216 is closed, and thus each of the NMOS transistor pair 210, 212 is diode-connected.

At a second time 304, the received control signal causes S2 to be asserted. The NMOS positive feedback operating phase begins at the second time 304, because the second set of switches 218, 220 is closed, and thus the NMOS transistor pair 210, 212 is cross-coupled. In the example of FIG. 3, S1 is de-asserted prior to the second time 304. However, in other examples, S1 can be de-asserted after the second time 304. Irrespective of when S1 is de-asserted, it is useful to de-assert S1 prior to S2 being de-asserted, which increases a gain of the comparator 100. Accordingly, there is a first time period (e.g., after the first time 302 and prior to the second time 304) in which the first set of switches 214, 216 is closed and the second set of switches 218, 220 is open. There is also a second time period (e.g., after the second time 304 and S1 being de-asserted) in which the second set of switches 218, 220 is closed and the first set of switches 214, 216 is open.

In some examples, the comparator 100 output can be used relatively shortly after S2 is asserted at the second time 304. However, certain factors such as the input signal level (e.g., VIN+ and VIN−) can cause the output voltages (e.g., at the first output node 204 and the second output node 208) to fail to be sufficiently high (e.g., close to VDD) and sufficiently low (e.g., close to ground) to be useful by standard digital logic module, such as the inverters 232,234. Thus, metastability or reliability concerns can exist if using the comparator 100 output relatively shortly after S2 is asserted. To avoid such metastability and/or reliability concerns, at a third time 306, the received control signal causes S3 to be asserted. The PMOS positive feedback operating phase begins at the third time 306, because the third switch 226 is closed, and thus the PMOS transistor pair 222, 224 operates in conjunction with the NMOS transistor pair 210, 212 to more quickly drive the voltages at the first output node 204 and the second output node 208 to the supply and ground voltages. Accordingly, there is also a third time period (e.g., after the third time 306) in which the first set of switches 214, 216 is open, the second set of switches 218, 220 is closed, and the third switch 226 is closed. In at least some examples, the third switch 226 is open during the first and second time periods described above.

Referring again to FIG. 2, the primary sources of offset in the comparator 100 include Vt mismatch of the PMOS input pair 202, 206; Vt mismatch of the NMOS transistor pair 210, 212; and Vt mismatch of the PMOS transistor pair 222, 224. As described above, NMOS transistors can have worse (e.g., larger) Vt mismatch than PMOS transistors. Accordingly, the examples herein compensate, correct, or otherwise reduce the Vt mismatch of the NMOS transistor pair 210, 212 by controlling the NMOS transistor pair 210, 212 in the diode-connected operating phase prior to the NMOS positive feedback operating phase. However, examples of this description can be similarly applied to provide circuitry to correct for the Vt mismatch of the PMOS transistor pairs as well.

The functionality of the comparator 100 is described in the following example, in which the voltage at VIN+ is greater than the voltage at VIN−. Because the first and second transistors 202, 206 are PMOS transistors in this example, a greater current flows through the second transistor 206 than through the first transistor 202 (e.g., because VIN−, which controls the second transistor 206, is less than VIN+). Accordingly, a voltage at the second output node 208 is greater than a voltage at the first output node 204.

In a case in which the diode-connected operating phase is not used, the NMOS transistor pair 210, 212 is cross-coupled (e.g., the second set of switches 218, 220 is closed, and the fourth set of switches 228, 230 is open). Because the voltage at the second output node 208 is greater than the voltage at the first output node 204, the fourth transistor 212 is more strongly on than the third transistor 210. Accordingly, the fourth transistor 212 starts to pull the first output node 204 towards ground, which in turn pushes the third transistor 210 towards being off, which in turn causes the voltage at the second output node 208 to increase. The fourth transistor 212 thus pulls the first output node 204 toward ground, while the third transistor 210 enables the second transistor 206 to pull the second output node 208 toward the supply voltage VDD. The NMOS transistor pair 210, 212 thus provides positive feedback to the voltages generated at the first output node 204 and the second output node 208 responsive to VIN+ and VIN−. However, any Vt mismatch of the NMOS transistor pair 210, 212 will affect their function responsive to the voltages at the first and second output nodes 204, 208, and thus contributes to the offset of the comparator 100.

Subsequently, such as in response to a triggering control signal (e.g., a rising clock edge), that closes the third switch 226, the PMOS transistor pair 222, 224 provides additional positive feedback to more strongly and/or quickly pull the voltages at the first and second output nodes 204, 208 to one of VDD or ground. For example, when the third switch 226 is closed, a greater current flows through the sixth transistor 224 than through the fifth transistor 222 because the voltage at the first output node 204, which controls the sixth transistor 224, is less than the voltage at the second output node 208. Because of the positive feedback provided both by the NMOS transistor pair 210, 212 and by the PMOS transistor pair 222, 224, the voltages at the first and second output nodes 204, 208 are pulled to ground and VDD, respectively. As described above, in this example, COUT is the first output node 204 inverted by the inverter 232, and thus COUT is asserted. Similarly, COUTZ is the second output node 208 inverted by the inverter 234, and thus COUTZ is de-asserted. The foregoing example is generally reversed when VIN− is greater than VIN+, and thus results in COUT being de-asserted and COUTZ being asserted.

Figure 4:
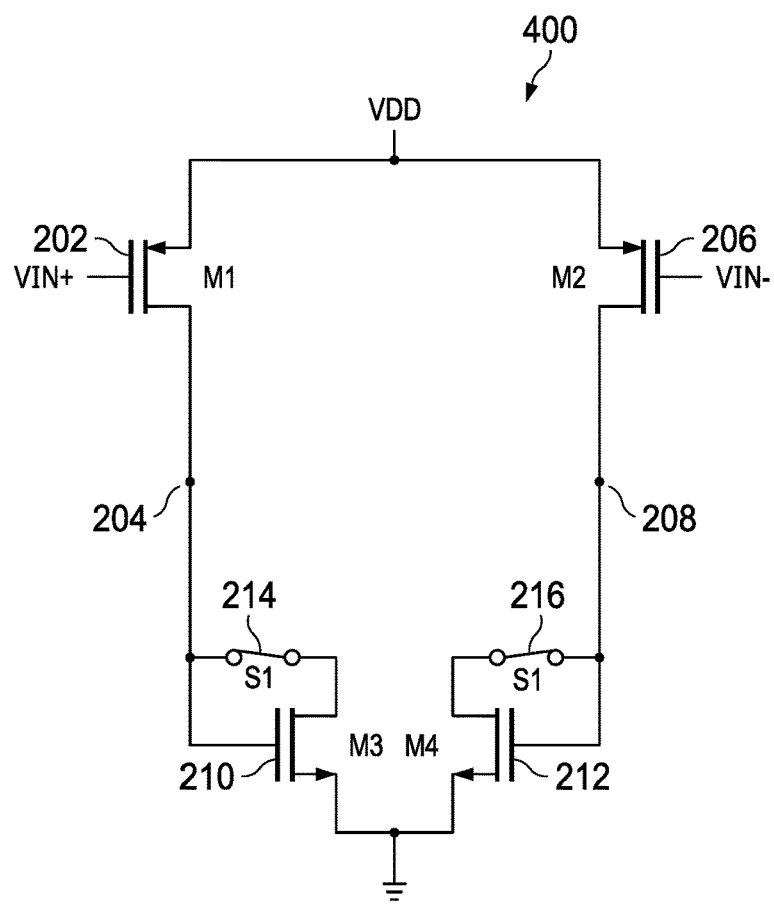
FIG. 4 is a schematic circuit diagram of the clocked comparator of FIG. 2 in a first operating phase in accordance with various examples.

As described above, examples described herein compensate, correct, or otherwise reduce the Vt mismatch of the NMOS transistor pair 210, 212 by controlling the NMOS transistor pair 210, 212 in the diode-connected operating phase prior to the NMOS positive feedback operating phase. FIG. 4 is a schematic circuit diagram of the clocked comparator 100 of FIG. 2 in a first configuration 400, which corresponds to the diode-connected operating phase, in accordance with various examples. As described above, the diode-connected operating phase begins in response to S1 being asserted. S2 and S3 are de-asserted at this time. The second set of switches 218, 220 (e.g., controlled by S2) is not shown in FIG. 4 because those switches 218, 220 are open. Also, the PMOS transistor pair 222, 224 is not shown in FIG. 4 because the third switch 226 (e.g., controlled by S3) being open effectively removes the PMOS transistor pair 222, 224 from the circuit.

In the first configuration 400, the first set of switches 214, 216 is closed, and each of the third transistor 210 and the fourth transistor 212 is diode-connected because the gate of each transistor 210, 212 is coupled to the drain of the same transistor 210, 212, respectively. Accordingly, in the diode-connected operating phase, the NMOS transistor of the pair that has a higher Vt will have a correspondingly higher gate-source voltage (Vgs) because $Vgs = Vt + \sqrt{K \ast Id}$, where Id is the drain current and K is a proportionality constant that is dependent on the device characteristics and size. For example, the third transistor 210 has a Vt of Vt0 and the fourth transistor 212 has a Vt of Vt1. For simplicity, it is assumed that there is no other source of offset in the comparator 100, and that VIN+ equals VIN−. In this example, the current through the first transistor 202 and the current through the second transistor 206 are equal, and the voltage at the gate of the third transistor 210 (e.g., the first output node 204) will be $Vgs210 = Vt0 + \sqrt{Id/K210}$, while the voltage at the gate of the fourth transistor 212 (e.g., the second output node 208) will be $Vgs212 = Vt1 + \sqrt{Id/K212}$. The terms K210 and K212 are device-specific constants (e.g., are dependent on particular characteristics of the third transistor 210 and the fourth transistor 212, respectively). Accordingly, the voltage at each of the first output node 204 and the second output node 208 is directly dependent on the Vt of the transistor having its gate coupled to that node, and can have a difference proportional to Vt0−Vt1 even with no difference between inputs.

Figures 5, 6:
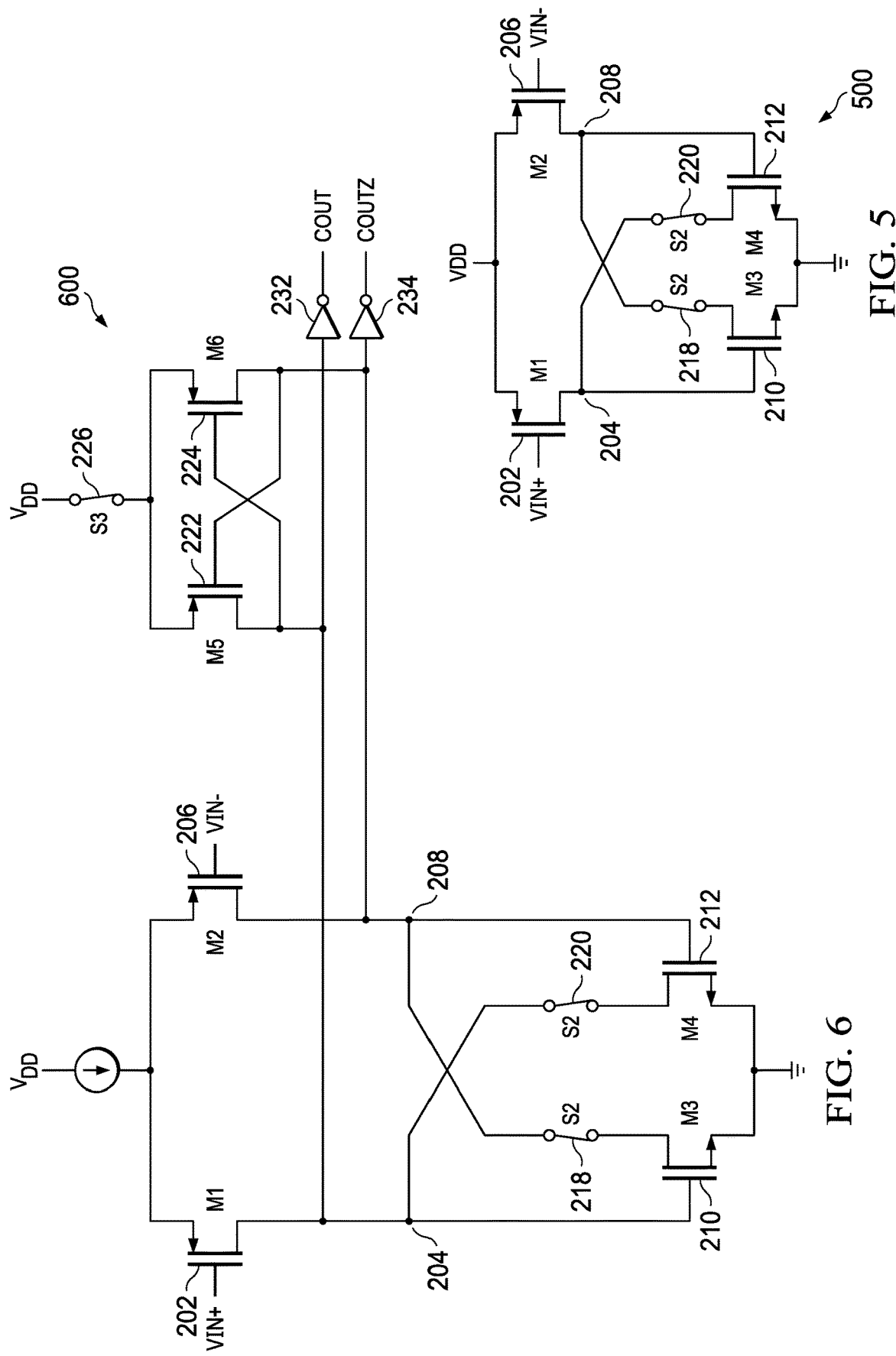
FIG. 5 is a schematic circuit diagram of the clocked comparator of FIG. 2 in a second operating phase in accordance with various examples.
FIG. 6 is a schematic circuit diagram of the clocked comparator of FIG. 2 in a third operating phase in accordance with various examples.

FIG. 5 is a schematic circuit diagram of the clocked comparator 100 of FIG. 2 in a second configuration 500, which corresponds to the NMOS positive feedback operating phase, in accordance with various examples. As described above, the NMOS positive feedback operating phase begins in response to S2 being asserted. S3 is de-asserted at this time. In the example of FIG. 5, S1 is de-asserted prior to the comparator 100 entering the second configuration. However, as explained above, in other examples there can be overlap between S2 being asserted and S1 being de-asserted. The first set of switches 214, 216 (e.g., controlled by S1) is not shown in FIG. 5 because those switches 214, 216 are open. Also, the PMOS transistor pair 222, 224 is not shown in FIG. 5 because the third switch 226 (e.g., controlled by S3) being open effectively removes the PMOS transistor pair 222, 224 from the circuit, as explained above.

In the second configuration 500, the second set of switches 218, 220 is closed, and each of the third transistor 210 and the fourth transistor 212 is cross-coupled because the gate of the third transistor 210 is coupled to the drain of the fourth transistor 212, and the gate of the fourth transistor 212 is coupled to the drain of the third transistor 210. As described above, in the NMOS positive feedback operating phase, the NMOS transistor pair 210, 212 provides positive feedback to the voltages generated at the first output node 204 and the second output node 208 responsive to VIN+ and VIN−. As described above in the first configuration 400 example, the voltage on the second output node 208 is Vgs212 and the voltage on the first output node 204 is Vgs210, which correct for Vt mismatch between the third transistor 210 and the fourth transistor 212. Thus, prior to the comparator 100 being in the second configuration 500, the voltages at the first output node 204 and the second output node 208 are different (e.g., reflecting any Vt mismatch). However, prior to the comparator 100 being in the second configuration 500, positive feedback has not yet been applied, and so the difference in voltages at the first output node 204 and the second output node 208 do not influence the comparison of VIN+ to VIN−. Accordingly, the comparator 100 enters the second configuration 500 with the voltage on the second output node 208 being Vgs212 and the voltage on the first output node 204 being Vgs210.

In the second configuration 500, the current through the third transistor 210 is given by $I210 = K210 \ast (Vgs210 - Vt0)^2 = Id$, and the current through the fourth transistor 212 is given by $I212=K212*(Vgs212-Vt1)^2=Id$. Accordingly, when the comparator 100 enters the second configuration 500 (e.g., the NMOS positive feedback operating phase), the current drawn by the third transistor 210 and the fourth transistor 212 is dependent on the input voltage difference alone (e.g., between VIN+ and VIN−) and not on Vt or differences in device size (e.g., K) between the third transistor 210 and the fourth transistor 212.

FIG. 6 is a schematic circuit diagram of the clocked comparator 100 of FIG. 2 in a third configuration 600, which corresponds to the PMOS positive feedback operating phase, in accordance with various examples. As described above, the PMOS positive feedback operating phase begins in response to S3 being asserted. S1 can be de-asserted at this time, while S2 remains asserted to continue to provide NMOS positive feedback as well. Accordingly, the first set of switches 214, 216 (e.g., controlled by S1) is not shown in FIG. 6 because those switches 214, 216 are open.

In the third configuration 600, the PMOS transistor pair 222, 224 provides additional positive feedback to more strongly and/or quickly pull the voltages at the first and second output nodes 204, 208 to one of VDD or ground. As described above, PMOS transistors generally have a smaller Vt mismatch than NMOS transistors. Further, because the NMOS transistor pair 210, 212 is already providing positive feedback, with offset cancelled or reduced, to the first and second output nodes 204, 208 at the time that the PMOS transistor pair 222, 224 begins to provide its additional positive feedback, the impact that Vt mismatch in the PMOS transistor pair 222, 224 has on the offset of the comparator 100 is reduced or eliminated.

Figure 7:
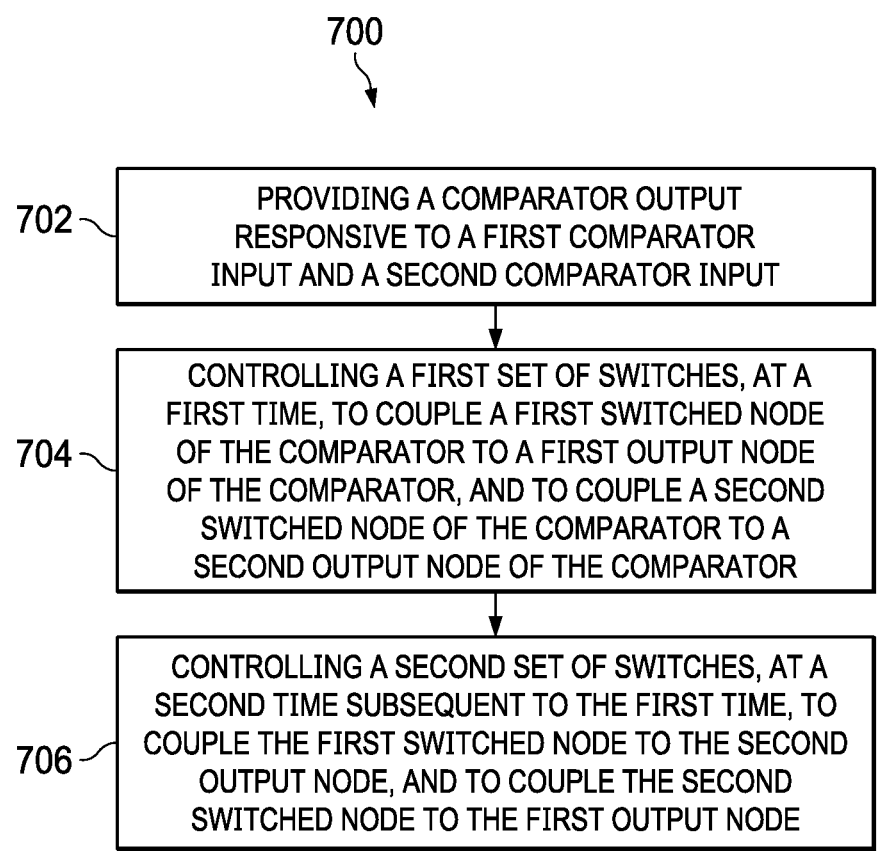
FIG. 7 is a flow chart of a method for operating the clocked comparator in the first, second, and third operating phases in accordance with various examples.

FIG. 7 is a flow chart of a method 700 for operating the clocked comparator 100 in the first, second, and third operating phases in accordance with various examples. In some examples, the steps of the method 700 can be performed in an order different than that shown in FIG. 7, and certain steps of the method 700 can be performed concurrently or sequentially.

The method 700 begins in block 702 with providing a comparator output responsive to a first comparator input and a second comparator input. For example, the comparator 100 is configured to receive first and second input voltages VIN+ and VIN−. The comparator 100 is configured to provide an output voltage at COUT responsive to VIN+ and VIN−. For example, the output voltage at COUT is asserted responsive to VIN+ being greater than VIN−, and is de-asserted responsive to VIN+ being less than VIN−. Further, the comparator 100 is a clocked comparator, and thus is configured to provide a voltage at COUT responsive to the control input CTRL. The control signal can be a clock signal from an external circuit in at least one example. Irrespective of the format of the control signal, the comparator 100 is generally triggered by the control signal received at CTRL, and is subsequently reset by a reset signal received at RESET. The output of the comparator 100 is available (e.g., to other circuitry, not shown for simplicity) after being triggered by the control signal, and before being reset by the reset signal.

The method 700 continues at block 704 with controlling a first set of switches, at a first time, to couple a first switched node of the comparator 100 to a first output node of the comparator 100, and to couple a second switched node of the comparator 100 to a second output node of the comparator 100. The comparator 100 output is provided responsive to a voltage at the first output node and/or a voltage at the second output node. For example, as explained with respect to FIGS. 2, 3, and 4, at the first time 302 a control signal is received that causes S1 to be asserted. S1 being asserted causes the first set of switches 214, 216 to close, and thus each of the NMOS transistor pair 210, 212 is diode-connected, beginning the diode-connected operating phase. As described above, the method 700 thus compensates, corrects, or otherwise reduces the Vt mismatch of the NMOS transistor pair 210, 212 by controlling the NMOS transistor pair 210, 212 in the diode-connected operating phase prior to the NMOS positive feedback operating phase.

The method 700 thus continues at block 706 with controlling a second set of switches, at a second time subsequent to the first time, to couple the first switched node to the second output node, and to couple the second switched node to the first output node. For example, as explained with respect to FIGS. 2, 3, and 5, at the second time 304 a control signal is received that causes S2 to be asserted. S2 being asserted causes the second set of switches 218, 220 to close, and thus the NMOS transistor pair 210, 212 is cross-coupled, beginning the NMOS positive feedback operating phase. As described above, in the NMOS positive feedback operating phase, the NMOS transistor pair 210, 212 provides positive feedback to the voltages generated at the first output node 204 and the second output node 208 responsive to VIN+ and VIN−, although the Vt mismatch of the NMOS transistor pair 210, 212, and thus one of the sources of comparator 100 offset, is compensated for by previously operating the NMOS transistor pair 210, 212 in the diode-connected operating phase.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A device, comprising:
   a first transistor having first transistor first and second terminals and a first transistor control terminal, wherein the first transistor control terminal is a first comparator input terminal, wherein the first transistor second terminal is a first comparator output;
   a second transistor having second transistor first and second terminals and a second transistor control terminal, wherein the second transistor control terminal is a second comparator input terminal, wherein the second transistor second terminal is a second comparator output;
   a third transistor having third transistor first and second terminals and a third transistor control terminal, wherein the third transistor control terminal is coupled to the first transistor second terminal;
   a fourth transistor having fourth transistor first and second terminals and a fourth transistor control terminal, wherein the fourth transistor control terminal is coupled to the second transistor second terminal;
   a first set of switches configured to:
      selectively couple the third transistor second terminal to the third transistor control terminal; and
      selectively couple the fourth transistor second terminal to the fourth transistor control terminal;
   a second set of switches configured to:
      selectively couple the third transistor second terminal to the second comparator output; and
      selectively couple the fourth transistor second terminal to the first comparator output; and
   a third set of switches configured to:
      selectively couple the third transistor control terminal to a ground node; and
      selectively couple the fourth transistor control terminal to the ground node.

2. The device of claim 1, wherein, during a first time period, the first set of switches is closed and the second set of switches is open, and wherein, during a second time period subsequent to the first time period, the first set of switches is open and the second set of switches is closed.

3. The device of claim 2, further comprising:
   a fifth transistor having fifth transistor first and second terminals and a fifth transistor control terminal, wherein the fifth transistor first terminal is adapted to be coupled to the supply voltage source, and wherein the fifth transistor second terminal is coupled to the first transistor second terminal; and
   a sixth transistor having sixth transistor first and second terminals and a sixth transistor control terminal, wherein the sixth transistor control terminal is coupled to the fifth transistor second terminal, wherein the sixth transistor first terminal is adapted to be coupled to the supply voltage source, wherein the sixth transistor second terminal is coupled to the second transistor second terminal, and wherein the fifth transistor control terminal is coupled to the sixth transistor second terminal.

4. The device of claim 3, further comprising a switch configured to selectively couple the supply voltage source to the fifth transistor first terminal and to the sixth transistor first terminal.

5. The device of claim 4, wherein during a third time period subsequent to the second time period, the first set of switches is open, the second set of switches is closed, and the switch is closed, and wherein the switch is open during the first and second time periods.

6. The device of claim 1, wherein the first transistor is a p-type metal-oxide-semiconductor (PMOS) transistor, the first transistor first terminal is a source, the first transistor second terminal is a drain, and the first transistor control terminal is a gate;
   wherein the second transistor is a PMOS transistor, the second transistor first terminal is a source, the second transistor second terminal is a drain, and the second transistor control terminal is a gate;
   wherein the third transistor is an n-type metal-oxide-semiconductor (NMOS) transistor, the third transistor first terminal is a source, the third transistor second terminal is a drain, and the third transistor control terminal is a gate; and
   wherein the fourth transistor is an NMOS transistor, the fourth transistor first terminal is a source, the fourth transistor second terminal is a drain, and the fourth transistor control terminal is a gate.

7. A device, comprising:
   a comparator circuit configured to receive a first comparator input and a second comparator input, and to provide a comparator output responsive to the first and second comparator inputs, the comparator circuit comprising:
      a first transistor adapted to be coupled to a supply voltage source and coupled to a first output node, wherein the first transistor is controlled responsive to the first comparator input;
      a second transistor adapted to be coupled to the supply voltage source and coupled to a second output node, wherein the second transistor is controlled responsive to the second comparator input;
      a third transistor adapted to be coupled to a ground node and coupled to a first switched node, wherein the third transistor is controlled responsive to a voltage at the first output node;
      a fourth transistor adapted to be coupled to the ground node and coupled to a second switched node, wherein the fourth transistor is controlled responsive to a voltage at the second output node;
      a first set of switches configured to selectively couple the first switched node to the first output node and selectively couple the second switched node to the second output node; and a second set of switches configured to selectively couple the first switched node to the second output node and selectively couple the second switched node to the first output node;

wherein the comparator is configured to provide the comparator output responsive to the voltage at the first output node or the voltage at the second output node; and a control circuit coupled to the comparator circuit, the control circuit configured to:

close the first set of switches at a first time, such that each of the third and fourth transistors is diode-connected; and close the second set of switches at a second time subsequent to the first time, such that the third and fourth transistors are cross-coupled.

8. The device of claim 7, wherein the control circuit is further configured to open the first set of switches before the second time.

9. The device of claim 7, wherein the control circuit is further configured to open the first set of switches after the second time.

10. The device of claim 7, wherein the comparator circuit further comprises:

a fifth transistor adapted to be coupled to the supply voltage source and coupled to the first output node, wherein the fifth transistor is controlled responsive to the voltage at the second output node; and a sixth transistor adapted to be coupled to the supply voltage source and coupled to the second output node, wherein the sixth transistor is controlled responsive to the voltage at the first output node.

11. The device of claim 10, further comprising a switch configured to selectively couple the supply voltage source to the fifth transistor and to the sixth transistor.

12. The device of claim 11, wherein the control circuit is further configured to close the third switch at a third time subsequent to the second time.

13. The device of claim 7, further comprising a third set of switches configured to:

selectively couple the first output node to the ground node; and selectively couple the second output node to the ground node.

14. A method comprising:

applying a first comparator input signal to a first transistor control terminal of a first transistor;

applying a second comparator input signal to a second transistor control terminal of a second transistor;

controlling a first set of switches, at a first time, to couple a third transistor current terminal of a third transistor to a first output node that is coupled to a third transistor control terminal of the third transistor, and to couple a fourth transistor current terminal of a fourth transistor to a second output node that is coupled to a fourth transistor control terminal of the fourth transistor;

controlling a second set of switches, at a second time subsequent to the first time, to couple the third transistor current terminal to the second output node, and to couple the fourth transistor current terminal to the first output node; and controlling a third set of switches to couple the first output node to a ground node, and to couple the second output node to the ground node;

wherein the third transistor is controlled responsive to a voltage at the first output node, and the fourth transistor is controlled responsive to a voltage at the second output node.

15. The method of claim 14, further comprising controlling the first set of switches to open before the second time.

16. The method of claim 14, further comprising controlling the first set of switches to open after the second time.

17. The method of claim 14, further comprising:

controlling a fifth transistor responsive to the voltage at the second output node, the fifth transistor having a fifth transistor current terminal coupled to the first output node; and controlling a sixth transistor responsive to the voltage at the first output node, the sixth transistor having a sixth transistor current terminal coupled to the second output node.

18. The method of claim 17, further comprising controlling a third switch, at a third time subsequent to the second time, to couple a supply voltage source to the fifth transistor and to the sixth transistor.

19. The method of claim 14, wherein the controlling of the third set of switches to couple the first and second output nodes to the ground node is performed at a third time prior to the first time, the method further comprising controlling the third set of switches, at a fourth time subsequent to the third time, to decouple the first and second output nodes from the ground node, the fourth time being the same as or prior to the first time.

20. The device of claim 1, wherein each of the first transistor first terminal and the second transistor first terminal is configured to be coupled to a supply voltage source, and each of the third transistor first terminal and the fourth transistor first terminal is configured to be coupled to the ground node.

* * * * *